United States Patent [19]

Schreck

[11] Patent Number: 5,311,480
[45] Date of Patent: May 10, 1994

[54] METHOD AND APPARATUS FOR EEPROM NEGATIVE VOLTAGE WORDLINE DECODING

[75] Inventor: John F. Schreck, Houston, Tex.

[73] Assignee: Texas Instruments Incorporated, Dallas, Tex.

[21] Appl. No.: 991,231

[22] Filed: Dec. 16, 1992

[51] Int. Cl.⁵ .............................................. G11C 8/00
[52] U.S. Cl. ................................ 365/230.06; 365/185; 365/218; 365/900
[58] Field of Search ................ 365/230.06, 185, 218, 365/900; 307/296.1, 296.2, 296.3, 296.4

[56] References Cited

U.S. PATENT DOCUMENTS

| | | | |
|---|---|---|---|
| 4,823,318 | 4/1989 | D'Arrigo et al. | 365/189 |
| 5,077,691 | 12/1991 | Haddad et al. | 365/218 |
| 5,214,606 | 5/1993 | Hashimoto | 365/230.06 |

OTHER PUBLICATIONS

Miyawaki et al., "A New Erasing and Row Decoding Scheme for Low Supply Voltage Operation 16-Mb/-64-Mb Flash Memories," IEEE Journal of Solid State Circuit, vol. 27, No. 4, Apr. 1992, pp. 583-588.
Mike McConnell, et al., "An Experimental 4-Mb Flash EEPROM with Sector Erase," IEEE Journal of Solid State Circuits, vol. 26, No. 4, Apr. 1991, pp. 484-491.
Harvey Stiegler, et al. "A 4Mb 5V-Only Flash EEPROM with Sector Erase," IEEE Symposium on VLSI Circuits, 1990, pp. 103-104.

Primary Examiner—Eugene R. LaRoche
Assistant Examiner—Huan Hoang
Attorney, Agent, or Firm—Dennis W. Braswell; Leo N. Heiting; Richard L. Donaldson

[57] ABSTRACT

A method and apparatus for negative wordline decoding in a flash EEPROM (10) is provided. In particular, a predecoder (26) generates a predecoding signal based on address and invert inputs. The predecoding signal is used to select wordlines in both positive and negative voltage decoding modes. Each wordline has associated with it a driver (28). The driver (28) receives the predecoding signal and is operable to drive the associated wordline high in response to the appropriate predecoding signal. Wordlines also have associated with them negative charge pumps (32). Each charge pump (32) is operable to drive the associated wordline negative when the driver (28) is not driving the wordline positive.

2 Claims, 4 Drawing Sheets

1

METHOD AND APPARATUS FOR EEPROM NEGATIVE VOLTAGE WORDLINE DECODING

TECHNICAL FIELD OF THE INVENTION

This invention relates generally to electrically erasable programmable read only memory (EEPROM) devices, and more particularly to a method and apparatus for EEPROM negative voltage wordline decoding.

BACKGROUND OF THE INVENTION

Electrically-erasable, programmable read-only memories (EEPROMS) employing single transistor memory cells (also referred to as bits), and which use hot carrier injection for programming and Fowler-Nordheim tunneling for erasure are in wide usage, and have been described, for example, in "A Single Transistor EEPROM Bit and Its Implementation in a 512K CMOS EEPROM(s)," Mukheree, et al., XEDM 1985, pp. 616–619, and "A 90 NS 100K Erase/Program Cycle Megabit Flash Memory," V. Kynett, et al., ISSCC 1989, pp. 140–141.

Such EEPROMs are programmed via hot-electron injection to a floating gate by the application of a high voltage to the control gate and drain of a particular memory bit while keeping the source of that memory bit grounded. For example, the drain programming voltage, $V_{dp}$ is kept below 6.5 volts while the control gate programming voltage, $V_{cgp}$ is held at 12 volts. Erasing is accomplished by applying a relatively high voltage across the control gate and source, while floating the drain. In typical EEPROMS, erasing is accomplished by maintaining the control gate voltage at $V_{cgo} = \theta$ volts, and raising the source to $V_{se} = 12$ volts. With flash EEPROMs, memory cells are divided into sectors. Within each sector, the sources of all of the memory cells are coupled to a common node. Thus, erasure in typical flash EEPROMs is on a sector by sector basis.

Memory cells in flash EEPROMs are N-type metal oxide semiconductor field effect transistors. Thus, N-type drains and sources are implanted in a P-type substrate. With standard erasing as described above, source to substrate current can be relatively high, due to source to substrate breakdown, since the substrate is typically held at zero volts. The magnitude of this substrate current increases as the number of memory cells within particular sectors increases, since all of the memory cells within a particular sector are erased at once. Because of this high current, which may be as high as ten milliamps in a one megabyte flash EEPROM chip, external power supplies are required to generate enough current at the higher voltages required for flash erasure. The requirement for such power supplies is unattractive, and thus flash EEPROMs without such a requirement are needed.

To avoid the substrate current problems described above, flash EEPROMs have been proposed in which erasing is accomplished by pulling the control gates negative with respect to the source voltage. For example, the source is held at zero volts while the control gates are lowered to minus sixteen volts. With the substrate also at zero volts, the substrate current problem is avoided. Another example pulls the control gate down to minus eleven volts, raises the source to five volts, and allows the drain to float, thus eliminating the need for a positive twelve volt power supply. Such circuits present the possibility of erasure down to a single wordline. However, circuits that allow for these negative voltages have not been able to decode many wordlines efficiently, without the use of triple well processes which result in process complexity.

Therefore, a need has arisen for a flash EEPROM which allows for negative voltage wordline decoding, and which allows for wordline decoding down to a single wordline.

SUMMARY OF THE INVENTION

In accordance with the present invention, a method and apparatus for negative voltage wordline decoding is provided which substantially eliminates or reduces disadvantages and problems associated with prior EEPROMS.

In particular, a flash electrically erasable programmable read only memory is provided which includes a plurality of memory cells. A column decoder is coupled to each of the memory cells, and each of the memory cells are also coupled to a plurality of wordlines. A read/write/erase circuit is coupled to the row decoder and the column decoder, such that the row decoder, column decoder, and read/write/erase circuit are operable to read, program, and erase the memory cells. The row decoder is operable to select and de-select the wordlines, and includes a plurality of driver circuits. Each of the driver circuits is respectively coupled to a different one of the wordlines, and the driver circuits are operable to drive the wordlines to non-negative voltage levels. The row decoder also includes a plurality of negative charge pumps. Each of the negative charge pumps are respectively coupled to a different one of the wordlines, and the negative charge pumps are operable to drive each of the wordlines, independently, to negative voltage levels.

In another embodiment, a plurality of negative charge pumps are provided, with each of the negative charge pumps respectively coupled to a different group of wordlines. Thus, the negative charge pumps are operable to drive each of the wordlines of each respective group, independently of other groups, to negative voltage levels.

An important technical advantage of the present invention is the fact that single wordlines in flash EEPROMs can be negatively decoded, thereby allowing for erasure of memory cells on any particular wordline.

Another important technical advantage of the present invention is that single wordlines, or groups of wordlines, can be negatively decoded with relatively few components. Furthermore, these few components may be fabricated with standard technologies, such as Complimentary Metal Oxide Semiconductor (CMOS) technology.

Another important technical advantage of the present invention is that high voltage power supplies, such as twelve volt power supplies, are not required external to the EEPROM chip, thereby reducing system cost and complexity.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The preferred embodiments of the present invention and its advantages are best understood by referring to FIGS. 1-12 of the drawings, like numerals being used for like and corresponding of the various drawings.

Figure 1:
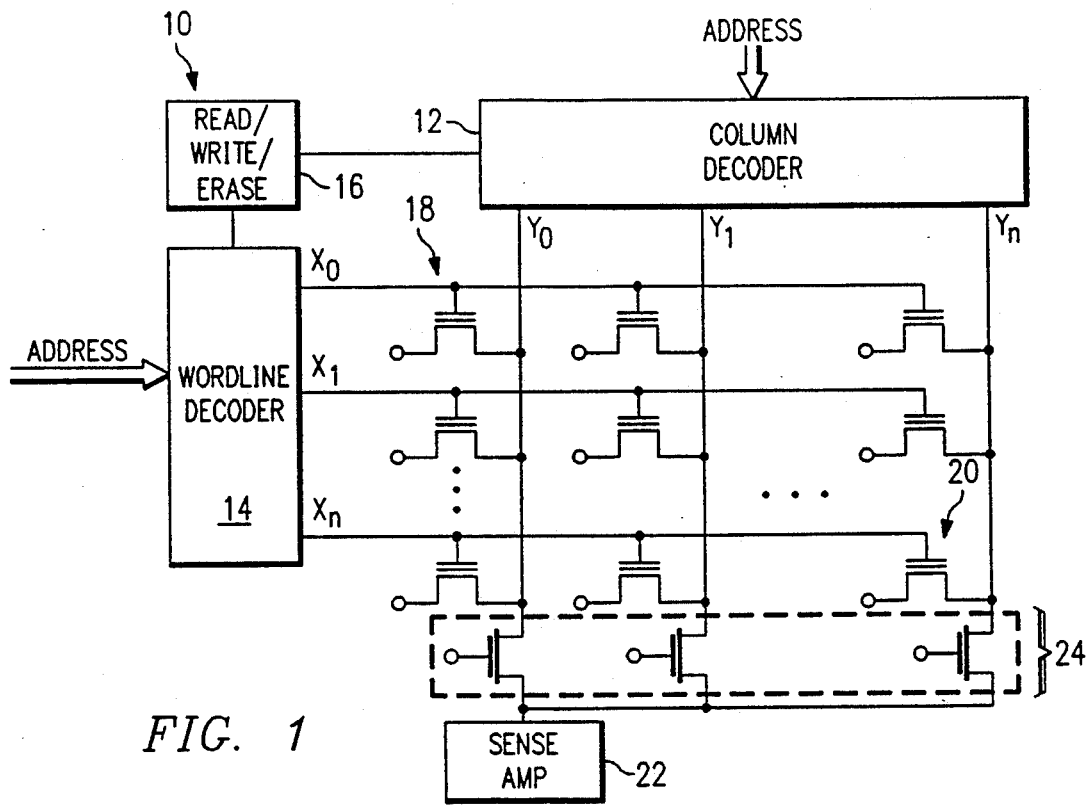
FIG. 1 is a schematic of an array of EEPROM memory cells.

FIG. 1 illustrates a block diagram and circuit schematic of a flash EEPROM 10. As shown, a column decoder 12 and wordline decoder 14 (also referred to as row decoder) are coupled to read/write/erase circuit 16. Column decoder 12 and wordline decoder 14 receive address information and access various memory cells in the array. These memory cells are either read, programmed (written), or erased, depending on the control signals from read/write/erase circuit 16.

Column decoder 12 controls several bit lines, designated as $Y_0, Y_1 \ldots Y_n$. Likewise, wordline decoder 14 controls several wordlines, designated $X_0, X_1, \ldots X_n$. The bit lines are coupled to the drains of memory bit transistors. The wordlines are coupled to the control gates of the memory cell transistors. For example, memory cell transistor 18 has its control gate coupled to wordline $X_0$ and its drain coupled to bit line $Y_0$. Similarly, memory cell 20 has its control gate coupled to wordline $X_n$, and its drain coupled to bit line $Y_n$. The states of the memory cell transistors are read by a sense amp 22. The state of a memory cell on a particular bit line is read through a pass gate transistor 24 associated with that bit line.

With flash EEPROMS, the sources of all of the memory cell transistors within a particular sector are coupled to a common node. FIG. 1 illustrates an array of memory cell transistors in a particular sector, it being understood that EEPROM 10 includes similar arrays in other sectors, also coupled to column decoder 12 and wordline decoder 14. Furthermore, arrays of transistors in other sectors may be physically separated from other sectors, or they may be electrically associated, for example by sharing wordlines or bit lines with other sectors.

Figure 2:
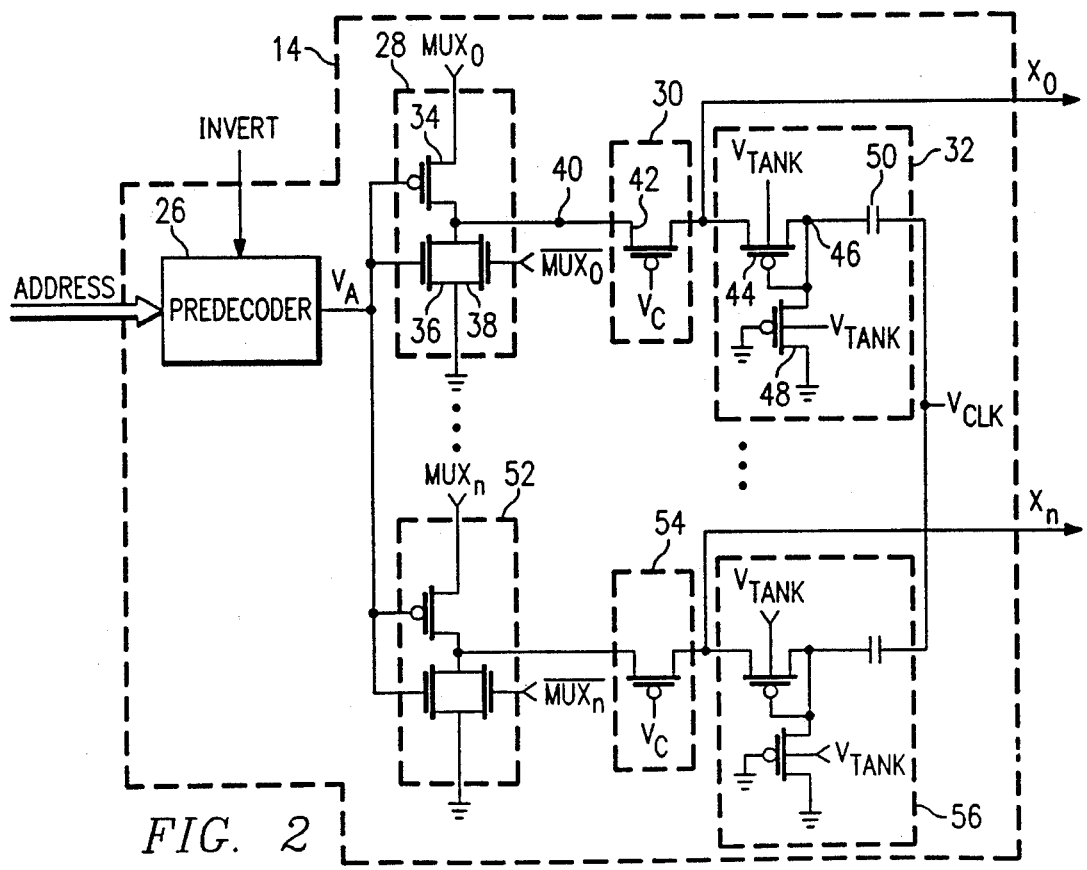
FIG. 2 is a circuit schematic of a particular embodiment of a negative voltage wordline decoder constructed according to the teachings of the present invention.

FIG. 2 illustrates a particular embodiment of circuitry included within wordline decoder 14 for negative wordline decoding according to the teachings of the present invention. Address signals are received by predecoder 26. Predecoder 26 also receives an invert signal from read/write/erase circuit 16. The invert signal controls whether predecoder 26 will cause negative voltage or positive voltage decoding of wordlines $X_0$ through $X_n$. In negative voltage decoding, wordlines can be brought negative, for example for erasing functions. In positive voltage decoding, wordlines can be brought positive, for example for programming or reading functions.

The circuitry of the particular embodiment shown in FIG. 2 will be discussed in connection with wordline $X_0$, it being understood that like circuitry is coupled to each wordline. A driver 28 is coupled to predecoder 26. Predecoder 26 outputs a predecoding signal $V_A$ to driver 28. Predecoding signal $V_A$, along with multiplexing signals $mux_0$–$mux_a$, wherein each mux signal is coupled to the appropriate driver for each wordline, allows for selection and deselection of each wordline. For example, $mux_0$ is coupled to driver 28 of wordline $X_0$. Driver 28 is coupled to the wordline $X_0$ through an isolation device 30. Isolation device 30 and wordline $X_0$ are also coupled to negative charge pump 32. Finally, negative charge pump 32 is coupled to a clock signal, $V_{clk}$.

In operation, each of the negative charge pumps attempt to pump their respective wordlines negative during negative voltage decoding. Wordlines are prevented from going negative by operation of the isolation devices and drivers, which charge their respective wordlines when appropriate. Thus, with the invert signal providing for negative voltage wordline decoding, wordlines will be brought negative if selected, and will be positive if de-selected, by operation of the isolation devices allowing either charging of or negative pumping of respective wordlines. Likewise, with the invert signal providing for positive voltage decoding, wordlines will be brought positive if selected, and zero if not selected, since the negative charge pumps do not pump negative in positive voltage decoding modes. As an example, negative wordline decoding is used in erase modes. Thus, in an erase mode, the invert signal will control predecoder 26 for negative wordline decoding. Predecoder 26, along with the $mux_i$ signals, and based on the addresses provided to it, will de-select and select the appropriate wordlines in both positive and negative decoding modes.

In previous negative wordline decoding schemes, decoding down to a single wordline has not been possible without the use of such process complex technologies as triple well processes. With the present invention, single wordline negative voltage decoding is provided with a relatively few number of devices, which may all be fabricated with standard technologies. Single wordline negative decoding is possible because each wordline is isolated from other wordlines by its negative charge pump, which has the ability to isolate wordlines. Furthermore, the circuits disclosed herein may be fabricated with standard CMOS technology.

FIG. 2 also shows a particular embodiment of circuitry for negative voltage wordline decoding according to the present invention. As shown, driver 28 is fabricated with CMOS technology, and includes a P-channel transistor 34 coupled to signal mux$_0$. Mux$_0$, along with predecoding signal $V_A$, allows for selection or deselection of the wordline. Transistor 34 is coupled through N-channel transistors 36 and 38 to ground. Transistor 36 has its gate coupled to predecoding signal $V_A$. The gate of transistor 38 is coupled to $\overline{mux_0}$. Transistor 34 is coupled to transistors 36 an 38 through node 40.

Node 40 is also coupled to isolation device 30, which in a particular embodiment includes transistor 42. The gate of transistor 42 is coupled to a preselected control voltage, $V_c$. Isolation device 40 allows wordline X$_0$ to be charged positively from driver 28 or negatively from negative charge pump 32, depending upon the voltage at node 40 and voltage at $V_c$.

In negative voltage wordline decoding modes, X$_0$ must be non-negative if it is de-selected. To accomplish this, isolation device 30, which in a particular embodiment is transistor 42, must be conducting, thereby coupling the voltage on node 40 to wordline X$_0$. Transistor 42 will conduct if the voltage at node 40 is greater than $V_c$ by more than the voltage threshold of transistor 42. Thus, for negative voltage wordline decoding, X$_0$ will be de-selected if $V_A$ is low and mux$_0$ is high with the driver 28 shown in FIG. 2. This will result in transistors 36 and 38 being off, transistor 34 being on, and the voltage of mux$_0$ being coupled to node 40. $V_c$ could also be brought slightly negative to ensure transistor 42 is conducting.

In negative voltage wordline decoding modes, wordline X$_0$ will be selected by having it go negative. This is accomplished by ensuring that isolation device 30 does not conduct. In a particular embodiment in which isolation device 30 comprises a transistor 42, it will not conduct if the voltage at node 40 is not greater than $V_c$ by more than the voltage threshold of transistor 42. Thus, with $V_c$ at ground, isolation device 30 will not conduct if node 40 is also grounded, and X$_0$ will go negative. This may be accomplished, in the particular embodiment for driver 28 shown in FIG. 2, with $V_A$ high or mux$_0$ low (at ground) and X$_0$ being pumped negative by negative charge pump 32. Furthermore, $V_c$ can be raised positive to prevent conduction through transistor 42.

In positive voltage decoding modes, the operation is similar to that in the negative voltage decoding modes, except that wordlines are selected at positive voltages, and de-selected at zero volts. The positive voltages are, in the embodiment shown in FIG. 2, coupled through the mux$_i$ signals, and thus these signals have varying voltage levels, depending on the operation, e.g., programming or reading. Throughout this discussion, it should be understood that the term "high" may be a voltage equal to approximately five to fifteen volts, and the term "low" may be a voltage of approximately zero volts. The following tables illustrate control voltages for positive voltage and negative voltage decoding, with X indicating high or low.

TABLE 1

| | POSITIVE VOLTAGE DECODING | | |
|---|---|---|---|
| | SELECTED | DESELECTED BY $V_A$ | DESELECTED BY mux$_i$ |
| mux$_i$ | High | X | Low |
| $V_A$ | Low | High | X |
| Isolation Device 30 | Conducting | Conducting | Conducting |
| $V_c$ | −4 V | −4 V | −4 V |

TABLE 2

| | NEGATIVE VOLTAGE DECODING | | |
|---|---|---|---|
| | DESELECTED | SELECTED BY $V_A$ | SELECTED BY mux$_i$ |
| mux$_i$ | High | X | Low |
| $V_A$ | Low | High | X |
| Isolation Device 30 | Conducting | Non-Conducting | Non-Conducting |
| $V_c$ | 0 | 0 | 0 |

As described above, single wordline negative voltage decoding of wordline X$_i$ is achieved through the use of predecoding signal $V_A$ and the mux$_i$ signals. In the particular embodiment shown, a single wordline X$_i$ can be selected by asserting that wordline's mux$_i$ signal. As the above tables show, the mux$_i$ and $V_A$ signals for negative voltage decoding are inverted from those for positive voltage decoding. The invert signal is input to predecoder 26 to yield the appropriate $V_A$. Similarly, the mux$_i$ signals are appropriately inverted for proper decoding for both negative voltage and positive voltage decoding.

FIG. 2 also shows a particular embodiment for negative charge pump 32. In a particular embodiment, negative charge pump 32 includes transistor 44 coupled between X$_0$ and node 46. The gate of transistor 44 is also coupled to node 46. Thus, transistor 44 is coupled as a diode. The substrate of transistor 44 is coupled to a voltage, $V_{TANK}$. A transistor 48 is also coupled between node 46 and ground. The gate of transistor 48 is coupled to ground. Node 46 is coupled to a clock signal, $V_{clk}$, through capacitor 50.

The signal $V_{clk}$ is a clock signal of magnitude equal to the desired negative wordline voltage plus two P-channel thresholds (for transistors 44 and 48) plus a constant. For a desired negative wordline voltage of minus 12 volts, $V_{clk}$ has a magnitude of 18 volts in a particular embodiment. Thus, $V_{clk}$ could go from zero to 18 volts or from minus 18 volts to zero volts, for example.

Negative charge pump 32, in the embodiment shown in FIG. 2, operates to pull wordline X$_0$ negative, with isolation device 30 not conducting, as follows. $V_{clk}$ is active only during negative voltage decoding, and thus negative charge pump 32 (and the other charge pumps associated with other wordlines) can pump wordline X$_0$ negative only during this negative voltage decoding. Initially, transistor 48 couples node 46 to approximately ground plus a P-channel voltage threshold. With $V_{clk}$ at 18 volts, a voltage is set up across capacitor 50. As $V_{clk}$ toggles down to zero volts, the voltage across capacitor 50 is maintained, since transistor 48 is not conducting. Thus, node 46 is pulled down negative. This negative voltage on node 46 in turn pulls down the voltage on wordline X$_0$. Capacitor 50 has the important effect of also isolating each wordline from other wordlines, since capacitors do not pass DC current.

Each wordline has coupled to it circuitry similar to that described above in connection with wordline $X_0$. Thus, for example, wordline $X_n$ also has a driver 52, an isolation device 54, and a negative charge pump 56. Driver 52 is coupled to predecoding signal $V_A$, mux$_a$, and $\overline{\text{mux}_a}$. Mux$_a$ couples various voltage levels to driver 52, and is derived from address signals. Along with predecoding signal $V_A$, mux$_a$ allows for selection or deselection of wordline $X_n$.

$V_{TANK}$ should be as low as possible to minimize breakdown between the wordline and $V_{TANK}$ when the wordline is brought negative. Furthermore, to allow the wordline to go positive, $V_{TANK}$ must also be at or above that same positive voltage. Since the lowest the deselected wordline voltage can be is a P-channel voltage threshold above $V_c$, $V_{TANK}$ should be set just above a P-channel voltage threshold. This is to ensure that transistor 42 can pass the voltage on node 40 when a wordline is deselected. Furthermore, as shown in FIG. 2, the maximum voltage that can appear on wordline $X_0$ is two times a P-channel voltage threshold, due to conduction through transistors 46 and 48.

Figure 3:
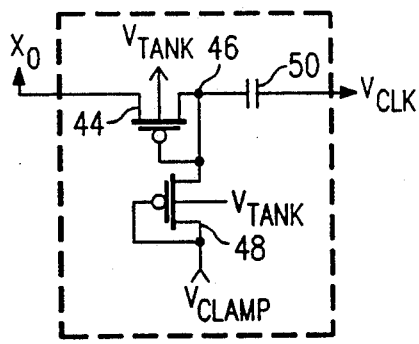
FIG. 3 is a circuit schematic of a particular embodiment of a negative charge pump constructed according to the teachings of the present invention.

FIG. 3 illustrates another embodiment of negative charge pump 32. As shown in FIG. 2, transistor 48 is coupled between node 46 and $V_{clamp}$. Furthermore, the gate of transistor 48 is also coupled to $V_{clamp}$. In this embodiment, $V_{clamp}$ may be adjusted to allow a variety of positive deselected voltage levels for the wordline. With this circuit embodiment, and with $V_{clamp}$ positive, the magnitude of $V_{clk}$ would have to be greater to achieve the same final negative voltage on wordline $X_0$ as that obtained with the embodiment shown in FIG. 2. $V_{clamp}$ can be modulated to keep $V_{clk}$ from going too high as $V_{clamp}$ is increased. For example, $V_{clamp}$ can be modulated to zero volts during negative voltage decoding, and thus $V_{clk}$ would not have to increase in magnitude to achieve appropriate negative voltages on the wordline.

Figure 4:
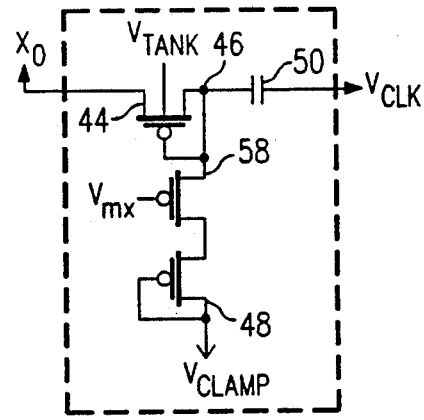
FIG. 4 is a circuit schematic of a particular embodiment of a negative charge pump constructed according to the teachings of the present invention.

FIG. 4 illustrates another embodiment of a negative charge pump according to the teachings of the present invention. The embodiment shown in FIG. 4 is similar that shown in FIG. 3, with the addition of transistor 58 between node 46 and transistor 48. The gate of transistor 58 is coupled to a voltage source $V_{mx}$. Transistor 58 reduces the maximum negative voltage seen across transistor 48, thus avoiding field plate breakdown or gated diode breakdown problems across transistor 48. Without transistor 58, the voltage difference between the voltage on node 46 and $V_{clamp}$ may be high enough to exceed the field plate breakdown voltage of transistor 48.

Figure 5:
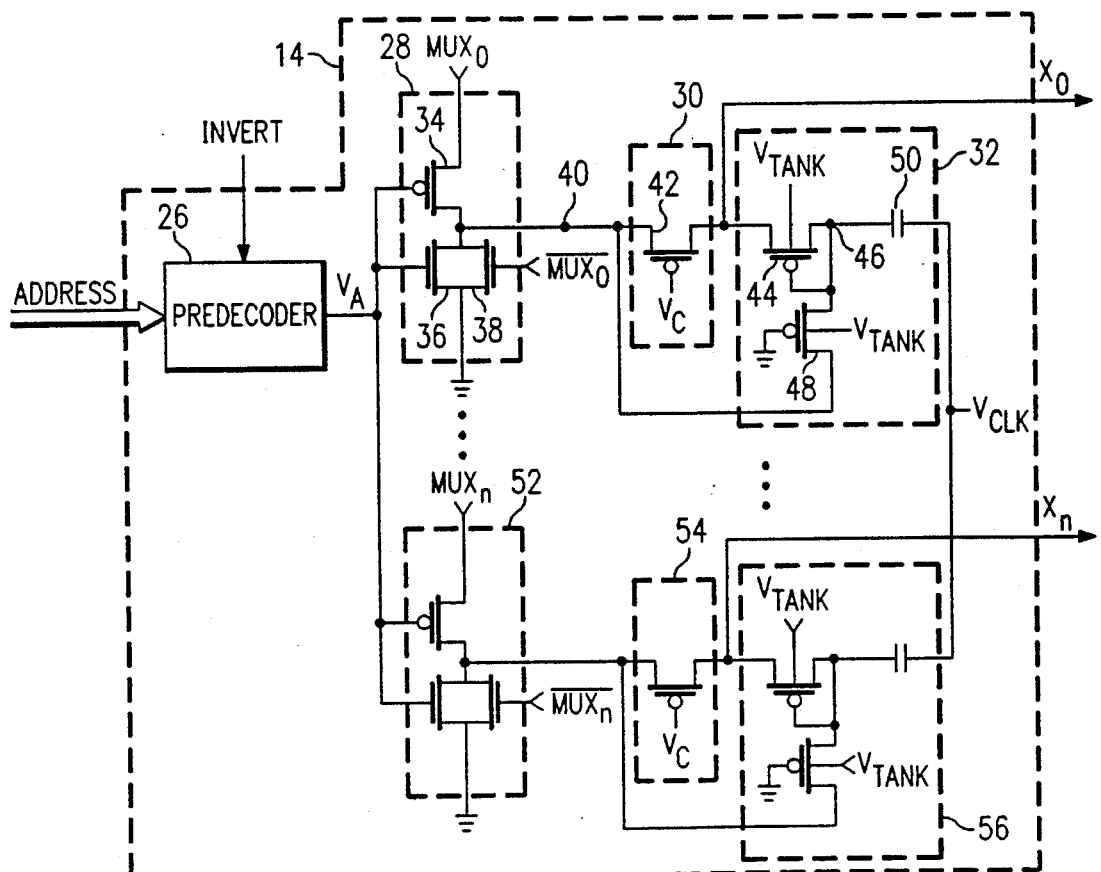
FIG. 5 is a circuit diagram of another embodiment of a negative voltage wordline decoder constructed according to the teachings of the present invention.

FIG. 5 illustrates another embodiment of negative charge pump 32 according to the teachings of the present invention. The circuit shown in FIG. 5 is shown with the same circuitry as that shown in FIG. 2, with the exception that transistor 48, rather than being coupled between node 46 and ground, is coupled between node 46 and node 40. The same is true for the circuitry of the other negative charge pumps, such as negative charge pump 56 associated with wordline $X_n$. In this embodiment, the voltage at node 40 will be applied to the source of transistor 48. Thus, in negative voltage decode modes, the source of transistor 48 will be pulled to ground if wordline $X_0$ is selected. If wordline $X_0$ is de-selected, then node 40 is approximately equal to the voltage on mux$_0$. Since this voltage is on the source of transistor 48, and on the wordline $X_0$, no current path exists between wordline $X_0$ and transistor 48, since there is no potential difference between them. Thus, power is conserved. Furthermore, the transistor 58 shown in FIG. 4 may also be coupled between transistor 46 and 48 shown in FIG. 5 to reduce the likelihood of field plate breakdown on transistor 48.

In some applications, negative voltage wordline decoding of each wordline independently is not required. In such applications, layout advantages exist if groups of wordlines are allowed to go negative together.

Figure 6:
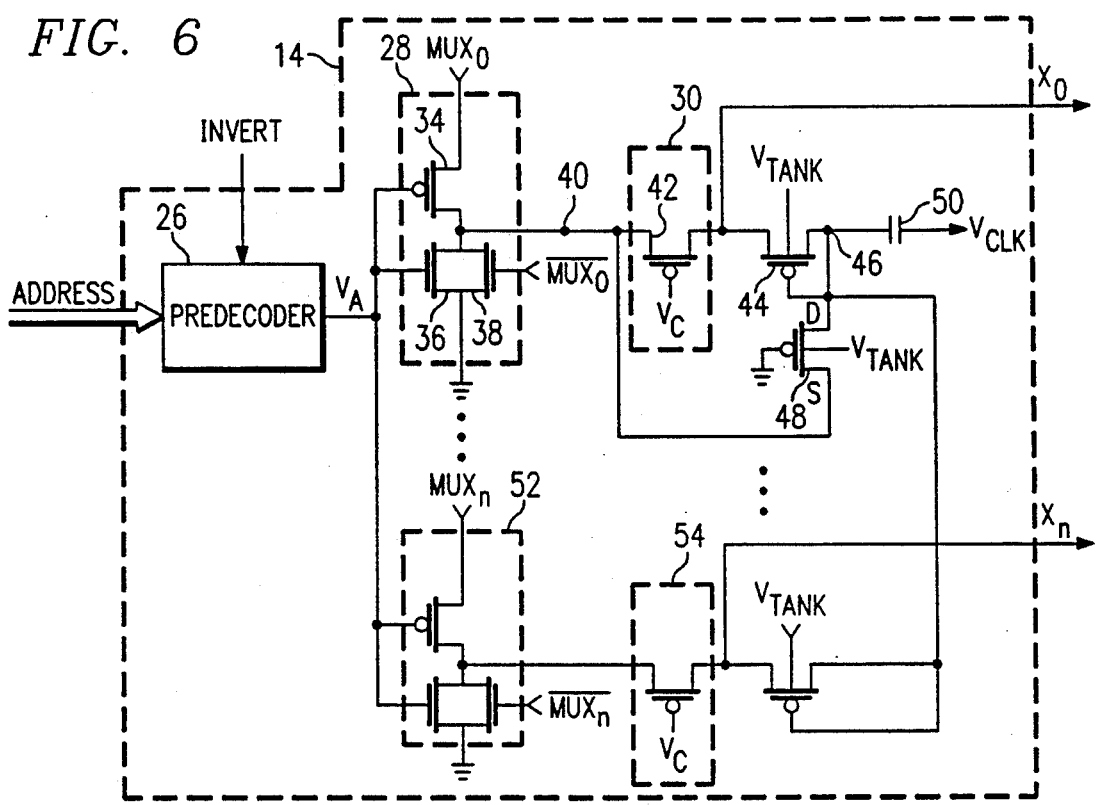
FIG. 6 is a circuit diagram of a particular embodiment of a negative wordline decoder constructed according to the teachings of the present invention for applications which do not require independent wordline decoding.

FIG. 6 illustrates an embodiment of the present invention in which a group of wordlines, $X_0$ through $X_n$, are allowed to go negative together. Each group of wordlines may be controlled by its own $V_A$ signal, which may be generated by predecoders dedicated to each group of wordlines. All of the dedicated predecoders may be referred to as a single predecoder with several predecoding outputs. As shown in FIG. 6, $V_{clk}$ is coupled directly to only one negative charge pump. Thus, only one capacitor 50 is needed for all n wordlines. Furthermore, only one transistor 48 is needed for all n wordlines. All of the wordlines within a group are pulled negative when node 46 is pulled negative. Each group of wordlines has its own negative charge pump. In this case, all of the mux$_i$ signals are high and $V_A$ is the only signal to select and deselected wordlines.

Figure 7:
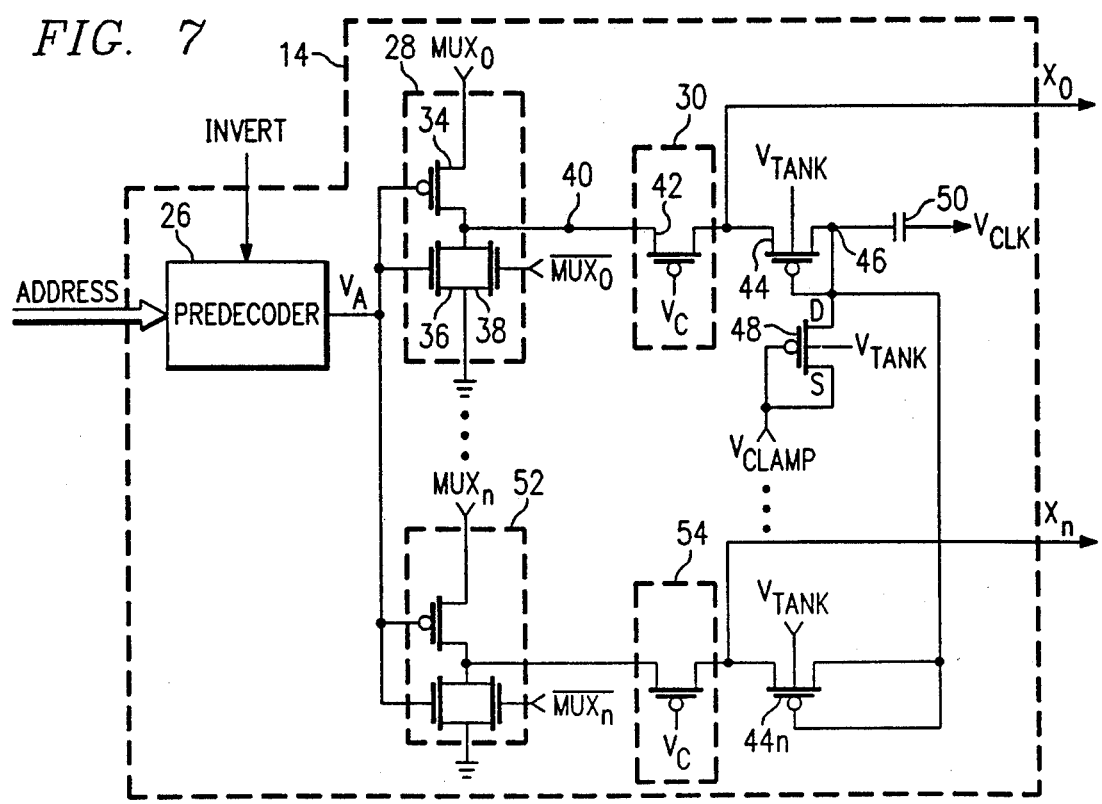
FIG. 7 is a circuit diagram of another embodiment of a negative voltage wordline decoder constructed according to the teachings of the present invention for applications which do not require independent wordline decoding.

FIG. 7 illustrates another embodiment in which groups of wordlines are allowed to go negative together. FIG. 7 incorporates circuitry similar to that shown in FIG. 3 in which the gate and source of transistor 48 are coupled to a voltage source $V_{clamp}$. Furthermore, node 46 is coupled to each of the other wordlines in the group through transistors 44$_i$. For example, as shown in FIG. 7, node 46 is coupled to wordline $X_n$ through transistor 44$_n$.

It should be understood that transistor 58, shown in FIG. 4, may be included in the embodiment shown in FIGS. 5, 6, and 7 to reduce the likelihood of field plate breakdown conditions across transistor 48.

Figure 8:
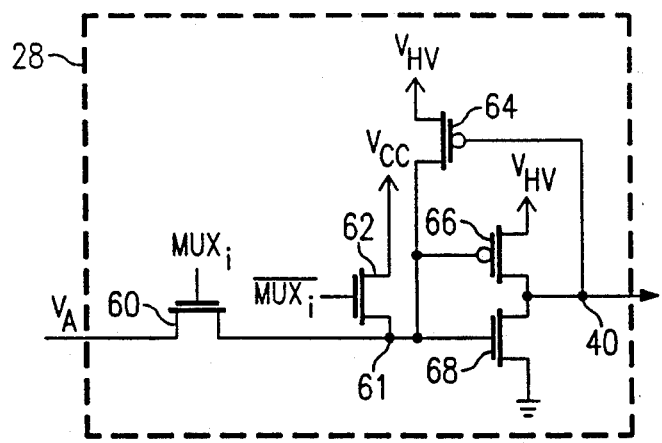
FIG. 8 is a circuit diagram of a particular embodiment of a driver constructed according to the teachings of the present invention.
Figure 9:
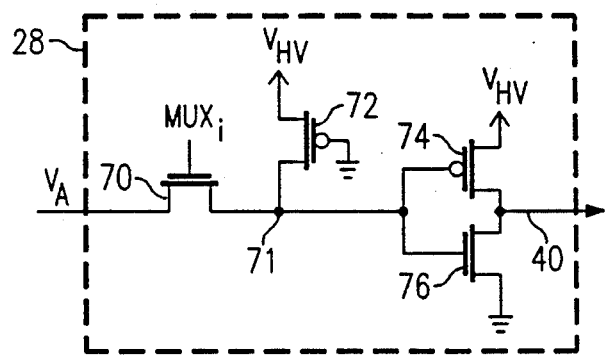
FIG. 9 is a circuit diagram of another embodiment of a driver constructed according to the teachings of the present invention.

As discussed previously, driver 28 is used to drive the wordline positive. The particular embodiment of driver 28 discussed in connection with FIG. 2 is but one embodiment which may be used. Other embodiments may also be used without departing from the intended scope herein. FIGS. 8 and 9 provide examples of particular drivers which may be used for driver 28 and the drivers on each of the other wordlines. As shown in FIG. 8, driver 28 may comprise a transistor 60 coupled between $V_A$ and node 61. The gate of transistor 60 is coupled to mux$_i$. Transistor 62 is coupled between $V_{cc}$, which may be 5 volts, and node 61. The gate of transistor 62 is coupled to $\overline{\text{mux}_i}$. A transistor 64 is also coupled between $V_{HV}$ and node 61. The gate of transistor 64 is coupled to node 40. Transistors 66 and 68 are also coupled between $V_{HV}$ and ground. The gates of transistors 66 and 68 are coupled to node 61. Furthermore, transistor 66 and 68 are also coupled to node 40 as shown. $V_{HV}$ is normally 5 volts, but is 12 volts during write operations.

As discussed previously, with node 40 high, the appropriate wordline cannot go negative. For node 40 to be high, node 61 must be low, which occurs with $V_A$ being low and mux$_i$ being high. For a wordline to be allowed to go negative, node 40 must be low, and thus node 61 must be high. Node 61 will be high if $V_A$ is high or mux$_i$ is low.

FIG. 9 illustrates another embodiment of a driver 28 according to the teachings of the present invention. As shown in FIG. 9, transistor 70 is coupled between $V_A$ and node 71. The gate of transistor 70 is coupled to mux$_i$. A transistor 72 is also coupled between V$_{HV}$ and node 71. The gate of transistor 72 is coupled to a control signal which is normally ground. Transistors 74 and 76 are also coupled between V$_{HV}$ and ground, and their gates are coupled to node 71. Transistors 74 and 76 are also coupled to node 40 as shown.

With V$_A$ low and mux$_i$ high, node 71 will be low, resulting in node 40 being high. With V$_A$ high or mux$_i$ low, node 71 will be high, resulting in node 40 being low.

Throughout the drawings, the components are shown with conventional notation. Thus, for example, transistor 34 is a P-channel metal oxide semiconductor field effect transistor. Similarly, transistor 36 is an N-channel metal oxide semiconductor field effect transistor.

Figure 10:
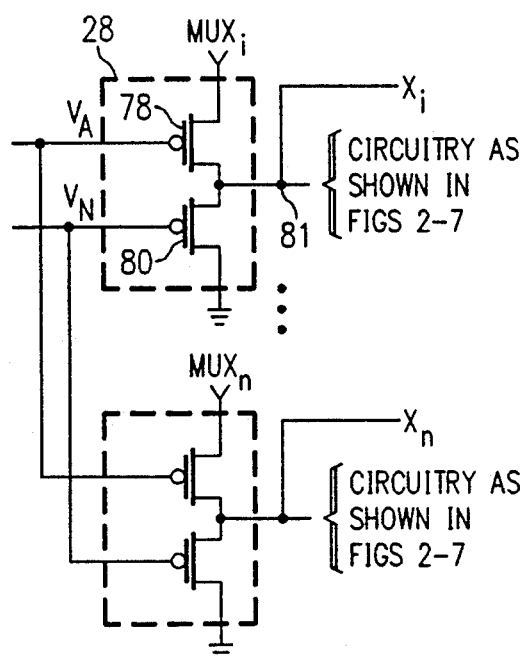
FIG. 10 is a circuit diagram of another embodiment of a negative voltage wordline decoder constructed according to the teachings of the present invention.

FIG. 10 illustrates another driver 28 constructed according to the teachings of the present invention. Driver 28 as shown in FIG. 10 includes two transistors 78 and 80 coupled between mux$_i$ and ground. These two transistors are both P-channel transistors, and the gate of transistor 78 is coupled to V$_A$. The gate of transistor 80 is coupled to a fixed voltage, V$_N$. Furthermore, transistors 78 and 80 are coupled to node 81. Node 81, as shown in FIG. 10, is coupled to the wordline associated with driver 28, for example wordline X$_i$. Node 81 is also coupled to any of the negative charge pump circuities as shown in FIGS. 2-7.

The driver shown in FIG. 10 provides the advantage of eliminating isolation device 30 shown in FIG. 2. Thus, using the driver 28 shown in FIG. 10 provides the advantage of an improved layout area. Another advantage is that no N-channel transistors are required beyond the predecoding stage. This reduces tank interferences in the layout and eliminates an N+junction that would be forward biased if the decoded wordline goes negative. Another advantage is that the driver 28 of FIG. 10 allows for faster low-to-high voltage transitions over that of previous negative voltage capability decoders.

In operation, in positive voltage decode modes, the wordline will be selected when V$_A$ is low and mux$_i$ is high. V$_N$ is a negative DC signal that pulls down the wordline when it is de-selected. The wordline is de-selected when V$_A$ is high or mux$_i$ is low. V$_N$ could be a fixed negative voltage or a clock signal that goes from a high state to a negative state periodically or at the beginning of a cycle. V$_N$ could also clock from a level to cause transistor 80 to move from a high impedance state to a lower impedance state to improve the high-to-low transition time.

In negative voltage decode modes, the wordline is selected when V$_A$ is high or mux$_i$ is low. The wordline is de-selected when V$_A$ is low and mux$_i$ is high.

Figure 11:
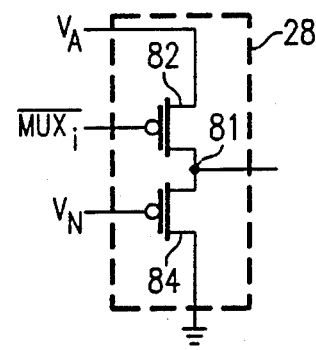
FIG. 11 is a circuit diagram of another embodiment of a driver constructed according to the teachings of the present invention.

FIG. 11 illustrates another embodiment of a decoder 28 that provides the same advantages as that discussed in connection with FIG. 10. As shown in FIG. 11, two P-channel transistors 82 and 84 are coupled between V$_A$ and ground. The gate of transistor 82 is coupled to $\overline{mux_i}$, and the gate of transistor 84 is coupled to V$_N$.

V$_A$ will be high and $\overline{mux_i}$ low for selected wordlines in the positive decode mode. For de-selected wordlines in the positive decode mode, V$_A$ is low or $\overline{mux_i}$ is high. In negative voltage decode modes, V$_A$ is low or $\overline{mux_i}$ is high for selected wordlines. For de-selected wordlines in negative voltage decode modes, V$_A$ is high and $\overline{mux_i}$ is low.

In positive voltage decode modes, V$_N$ should be at least one P-channel voltage threshold below the de-selected wordline voltage. Thus, the wordline X$_i$ shown in FIGS. 10 and 11 can be pulled to ground. The more negative V$_N$ is, then the faster wordline X$_i$ will be pulled to ground.

Figure 12:
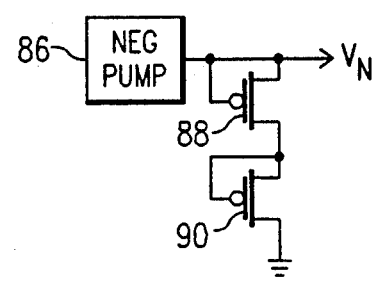
FIG. 12 is a particular embodiment of a $V_N$ voltage supply for the circuits shown in FIGS. 10 and 11.

For programming EEPROMs or flash EEPROMS, high voltages are provided from the mux$_i$ inputs through transistors 78 and 82 shown in FIGS. 10 and 11. In these high voltage modes, transistors 80 and 84 shown in FIGS. 10 and 11 may be made less conductive. Thus, it may be desirable to clamp V$_N$ at some given value to maintain relatively consistent levels closer to ground with varying process parameters to establish low conduction through transistors 80 and 84. FIG. 12 illustrates such an embodiment. As shown, V$_N$ is generated by negative charge pump 86. V$_N$ is clamped by transistors 88 and 90 connected as shown in FIG. 12.

Although the present invention and its advantages have been described in detail, it should be understood that various changes, substitutions, and alterations can be made without departing from the intended scope of the invention as defined by the appended claims.

What is claimed is:

1. A method of decoding wordlines in a flash electrically erasable, programmable read only memory having a plurality of memory cells, comprising the steps of:
   generating negative voltages in a plurality of negative charge pumps, each of the negative charge pumps coupled to a different wordline;
   generating a predecoding signal in a predecoder;
   generating non-negative voltages in a plurality of driver circuits in response to the predecoding signal, each of the driver circuits coupled to a different wordline; and
   coupling to each wordline either the negative voltage from the respective negative charge pump or the non-negative voltage from the respective driver circuit, in response to the predecoding signal.

2. A method of decoding wordlines in a flash electrically erasable, programmable read only memory having a plurality of memory cells, comprising the steps of:
   generating negative voltages in a plurality of negative charge pumps, each of the negative charge pumps coupled to a different group of wordlines;
   generating predecoding signals in a predecoder;
   generating non-negative voltages in a plurality of driver circuits in response to the predecoding signals, each of the driver circuits coupled to a different wordline;
   coupling to each group of wordlines the negative voltage from the respective negative charge pump in response to the predecoding signals; and
   coupling to each wordline the non-negative voltages from the respective driver circuit in response to the predecoding signals.

* * * * *